(12) United States Patent
Wang et al.

(10) Patent No.: US 12,402,543 B2
(45) Date of Patent: Aug. 26, 2025

(54) TWO-DIMENSIONAL SCALABLE SUPERCONDUCTING QUBIT STRUCTURE AND METHOD FOR CONTROLLING CAVITY MODE THEREOF

(71) Applicant: UNIVERSITY OF SCIENCE AND TECHNOLOGY OF CHINA, Anhui (CN)

(72) Inventors: Shiyu Wang, Anhui (CN); Futian Liang, Anhui (CN); Hui Deng, Anhui (CN); Ming Gong, Anhui (CN); Yulin Wu, Anhui (CN); Chengzhi Peng, Anhui (CN); Xiaobo Zhu, Anhui (CN); Jianwei Pan, Anhui (CN)

(73) Assignee: UNIVERSITY OF SCIENCE AND TECHNOLOGY OF CHINA, Anhui (CN)

( * ) Notice: Subject to any disclaimer, the term of this patent is extended or adjusted under 35 U.S.C. 154(b) by 533 days.

(21) Appl. No.: 17/780,731

(22) PCT Filed: Jul. 1, 2020

(86) PCT No.: PCT/CN2020/099765
§ 371 (c)(1),
(2) Date: May 27, 2022

(87) PCT Pub. No.: WO2021/103530
PCT Pub. Date: Jun. 3, 2021

(65) Prior Publication Data
US 2022/0416145 A1 Dec. 29, 2022

(30) Foreign Application Priority Data
Nov. 29, 2019 (CN) .......................... 201911210369.4

(51) Int. Cl.
*H10N 60/81* (2023.01)
*H10N 60/01* (2023.01)

(52) U.S. Cl.
CPC ............. *H10N 60/81* (2023.02); *H10N 60/01* (2023.02)

(58) Field of Classification Search
CPC ......... H10N 60/81; H10N 69/00; G06N 10/40
See application file for complete search history.

(56) References Cited

U.S. PATENT DOCUMENTS 10,374,612 B1 8/2019 Sinclair et al.
2019/0296211 A1* 9/2019 Chow .................... G06N 10/40

FOREIGN PATENT DOCUMENTS

CN 110402446 A 11/2019
CN 110444526 A 11/2019
(Continued)

OTHER PUBLICATIONS

Iadecola et al. "Stroboscopic Symmetry-Protected Topological Phases," arXiv:1503.07871 (Year: 2015).*
(Continued)

*Primary Examiner* — Matthew L Reames
(74) *Attorney, Agent, or Firm* — Scully, Scott, Murphy & Presser, P.C.

(57) ABSTRACT

The present disclosure provides a two-dimensional scalable superconducting qubit structure and a method for controlling a cavity mode thereof. The two-dimensional scalable superconducting qubit structure includes: a superconducting qubit chip comprising a plurality of two-dimensionally distributed and scalable qubits; a capacitor part of each of the qubits has at least five arms distributed two-dimensionally, two of the at least five arms in each qubit are respectively connected
(Continued)

with a read coupling circuit and a control circuit, and the other at least three arms are coupled with adjacent qubits through a coupling cavity.

5 Claims, 6 Drawing Sheets

(56) References Cited

FOREIGN PATENT DOCUMENTS

| | | |
|---|---|---|
| CN | 111081768 A | 4/2020 |
| WO | 2019117930 A1 | 6/2019 |

OTHER PUBLICATIONS

ArXiv:1503.07871 (Year: 2015).*
International Search Report dated Sep. 23, 2020 issued in PCT/CN2020/099765.
Chinese Office Action dated May 31, 2021 issued in CN 201911210369.4.
Chinese Office Action dated Oct. 27, 2020 issued in CN 201911210369.4.

* cited by examiner

TWO-DIMENSIONAL SCALABLE SUPERCONDUCTING QUBIT STRUCTURE AND METHOD FOR CONTROLLING CAVITY MODE THEREOF

CROSS REFERENCE TO RELATED APPLICATION

This application is a Section 371 National Stage Application of International Application No. PCT/CN2020/099765, filed on Jul. 1, 2020, entitled "TWO-DIMENSIONAL SCALABLE SUPERCONDUCTING QUBIT STRUCTURE AND METHOD FOR CONTROLLING CAVITY MODE THEREOF", which is incorporated herein by reference in its entirety which claims priority to Chinese Application No. 201911210369.4, filed on Nov. 29, 2019, incorporated herein by reference in their entirety.

TECHNICAL FIELD

The present disclosure belongs to a field of quantum computing technical, and relates to a two-dimensional scalable superconducting qubit structure and a method for controlling a cavity mode thereof.

BACKGROUND

Superconducting quantum computing utilizes a superposition, an entanglement and other properties of a quantum state of a superconducting qubit to achieve quantum computing. The superconducting qubit may be fabricated on a chip using a micro-nano processing technology, which has a superior performance such as integration and scalability. Superconducting quantum computing has developed rapidly in recent years. However, for a one-dimensional chain qubit structure, each bit is only coupled with two adjacent qubits on the left and right, and the structure has a certain limitation.

Implementation of many quantum simulation algorithms, such as a two-dimensional Ising model, a lattice simulation, and a phase transition simulation, requires a two-dimensional qubit structure. In addition, implementation of general quantum computing requires a quantum error correction. There is now a promising error correction code scheme, such as a surface code, which also requires a two-dimensionally distributed qubit structure, and the two-dimensional qubit structure also has a better scalability.

With an increase of the number of qubits, the following problems need to be solved: 1. an increase in a wiring density and line length will bring a crosstalk between different bits and a signal attenuation; 2. in a two-dimensional structure, control and read circuits of an intermediate bit are difficult to extend to an edge of the chip for a wire bonding, and a control signal and reading must be input and output from a center of the chip; 3. with an increase of the chip, a volume of a sample box also increases, and the sample box acts as a resonant cavity to generate a resonant mode that may be coupled to the quantum chip, thereby affecting performances of the chip; 4. with an increase of the chip, if a traditional method of grounding around the chip is used, the center of the chip is poorly grounded, which may produce some stray resonance modes and affect performances of the qubits.

SUMMARY

In view of this, the present disclosure provides a two-dimensional scalable superconducting qubit structure and a method for controlling a cavity mode thereof, so as to at least partially solve the above-mentioned technical problems.

According to an aspect of the present disclosure, there is provided a two-dimensional scalable superconducting qubit structure, including: a superconducting qubit chip including a plurality of two-dimensionally distributed and scalable qubits, wherein a capacitor part of each of the qubits has at least five arms distributed two-dimensionally, two of the at least five arms in each qubit are respectively connected with a read coupling circuit and a control circuit, and the other at least three arms are coupled with adjacent qubits through a coupling cavity.

In an embodiment of the present disclosure, the qubit has a separate XY control circuit and a Z control circuit, or the qubit has only a XY control circuit.

In an embodiment of the present disclosure, at least two qubits share a read coupling circuit.

In an embodiment of the present disclosure, the plurality of two-dimensionally distributed qubits form a qubit array.

In an embodiment of the present disclosure, an included angle between two adjacent arms of six arms in the qubit is greater than 0° and less than or equal to 180°.

In an embodiment of the present disclosure, some of the plurality of two-dimensionally distributed qubits have the same number of arms, and some of the plurality of two-dimensionally distributed qubits have unequal numbers of arms; for the qubits having the same number of arms, the arms in each qubit are distributed in a partially same form, a completely same form or a completely different form.

In an embodiment of the present disclosure, the qubit array includes one or more of distribution forms of a honeycomb distribution, a grid-like distribution, a snowflake distribution or a tree-like distribution.

According to another aspect of the present disclosure, there is provided a method for controlling a cavity mode of a two-dimensional scalable superconducting qubit structure, including forming a three-dimensional lead structure at a position of a non-qubit circuit in the superconducting qubit chip by using flip-chip bonding and through-silicon via processes, so as to perform a signal extraction.

According to yet another aspect of the present disclosure, there is provided a method for controlling a cavity mode of a two-dimensional scalable superconducting qubit structure, including manufacturing a plurality of holes at a position of a non-qubit circuit in the superconducting qubit chip, wherein a control circuit and a read coupling circuit of the qubit are wire-bonded to a package box or a circuit board through several holes of the plurality of holes.

In an embodiment of the present disclosure, control circuits between two adjacent qubits are extracted from different holes for bonding.

In an embodiment of the present disclosure, the plurality of holes are distributed in an array.

BRIEF DESCRIPTION OF THE DRAWINGS

FIG. 3 shows an exemplary array distribution form in which capacitive coupling arms of each qubit connected between the plurality of qubits are 4 arms; FIG. 4 shows an exemplary array distribution form in which capacitive coupling arms connected of each qubit between the plurality of qubits are 3 arms; and FIG. 5 shows an exemplary array distribution form in which capacitive coupling arms of each qubit connected between the plurality of qubits are 6 arms.

| Description of symbols | |
| --- | --- |
| 1-qubit; | |
| 11-first arm; | 12-second arm; |
| 13-third arm; | 14-fourth arm; |
| 15-fifth arm; | 16-sixth arm; |
| 2-read coupling circuit; | 3-control circuit. |

DETAILED DESCRIPTION OF EMBODIMENTS

In order to make the objectives, technical solutions and advantages of the present disclosure clearer, the present disclosure will be further described in detail below with reference to specific embodiments and the drawings.

A First Embodiment

In a first exemplary embodiment of the present disclosure, there is provided a two-dimensional scalable superconducting qubit structure.

Figure 1:
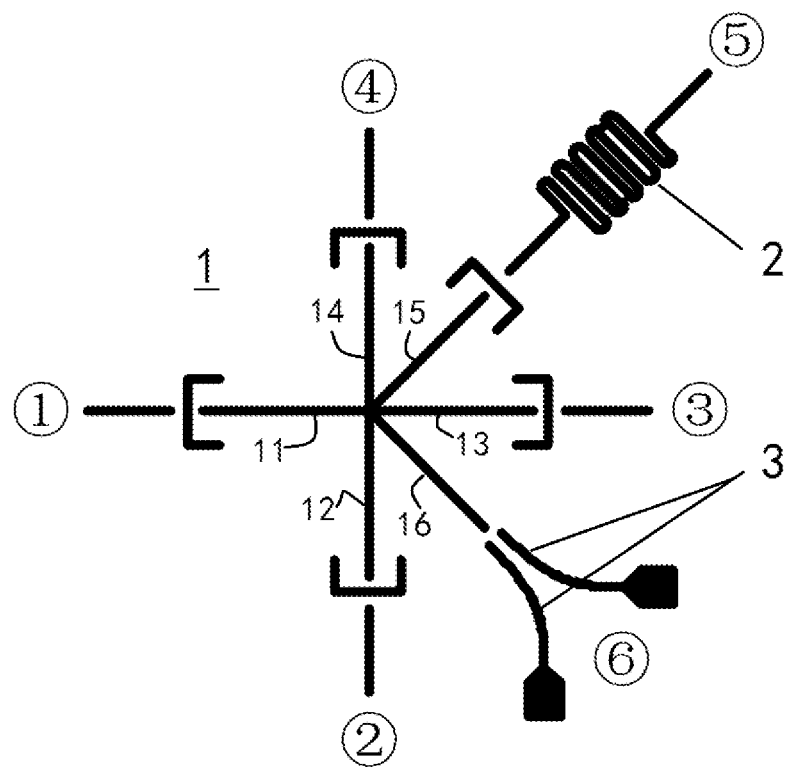
FIG. 1 shows a schematic diagram of a two-dimensional scalable superconducting qubit structure according to an embodiment of the present disclosure.

FIG. 1 shows a schematic diagram of a two-dimensional scalable superconducting qubit structure according to an embodiment of the present disclosure.

Referring to FIG. 1, the two-dimensional scalable superconducting qubit structure according to the present disclosure includes: a superconducting qubit chip containing a plurality of two-dimensionally distributed and scalable qubits. A capacitor part of each of the qubits has at least five arms distributed two-dimensionally, two of the at least five arms in each qubit are respectively connected with a read coupling circuit and a control circuit, and the other at least three arms are coupled with adjacent qubits through a coupling cavity.

Referring to FIG. 1, in the embodiment, taking that a capacitor part of a qubit 1 has six arms as an example, corresponding six arms are respectively a first arm 11, a second arm 12, a third arm 13, a fourth arm 14, a fifth arm 15 and a sixth arm 16. Two of the six arms are respectively connected with the read coupling circuit and the control circuit. For example, taking that the fifth arm 15 is connected with a read coupling circuit 2 and the sixth arm 16 is connected to a control circuit 3 as an example, the other four arms are coupled with adjacent qubits through a coupling cavity, which corresponds to an expanded form of six lines ① to ⑥ that is formed in two dimensional directions with the qubit 1 as the center in FIG. 1. Four lines such as the four lines ① to ④ in the embodiment are coupled with adjacent qubits in four directions.

Certainly, it should be noted that in the present disclosure, the number of arms in each qubit is at least 5, that is, at least 3 arms are coupled with other adjacent qubits. Except for the example of 6 arms introduced above, the number of arms of each qubit may be 7, 8 or even more. The specific connection form may be designed according to actual needs. A length of each arm and a distribution of included angles between arms may be arranged after simulation or calculation.

Among the above-mentioned arms, the following description will be described with a capacitive expansion arm or an arm of the capacitor part, and the two have the same meaning.

In an embodiment of the present disclosure, the qubit has a separate XY control circuit and a Z control circuit, or the qubit has only a XY control circuit. That is, for a capacitive expansion arm of the qubit for connecting the control circuit, the XY control circuit and the Z control circuit may be connected separately, or only the XY control circuit may be connected.

The distribution form of the capacitive expansion arm in the qubit will be introduced with specific examples.

Figure 2:
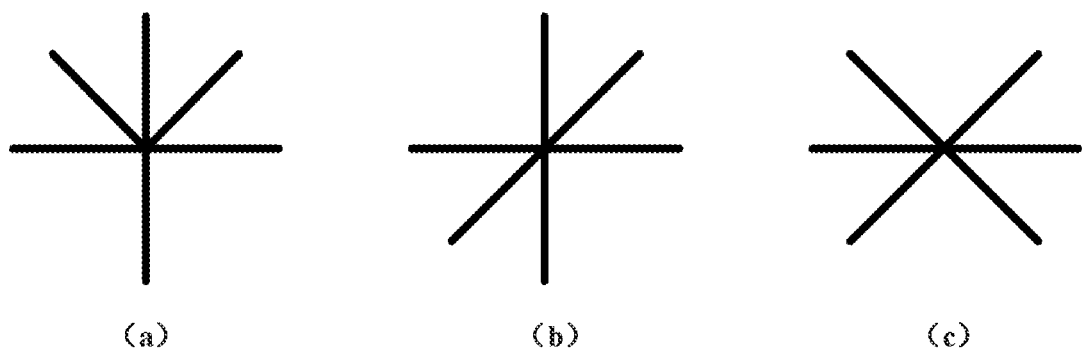
FIG. 2 shows a schematic diagram of a distribution form of six arms distributed two-dimensionally of a capacitor part of a qubit according to an embodiment of the present disclosure.

FIG. 2 shows a schematic diagram of a distribution form of six arms distributed two-dimensionally of a capacitor part of a qubit according to an embodiment of the present disclosure.

The distribution form of the at least five arms that the capacitor part of the qubit of the present disclosure may be various two-dimensional distributions. In an embodiment of the present disclosure, an included angle between two adjacent arms of six arms in the qubit is greater than 0° and less than or equal to 180°.

Some cases of two-dimensional distribution are, for example, an axisymmetric graphic or a center-symmetric graphic, or other asymmetric graphics, as long as included angles of the six arms are distributed and covered to a range of 360°. For example, in an embodiment, referring to (a) and (b) in FIG. 2, when the capacitor part of the qubit includes six arms, four of the six arms are perpendicular to each other in a "cross" shape, and one of the other two arms are distributed between any two adjacent arms among the four arms and the other one is distributed between the other three groups of two adjacent arms. Specifically, which two arms are connected with the read coupling circuit and the control circuit, and which four arms are coupled with adjacent qubits may be selected according to actual connection expansion conditions. Alternatively, in another embodiment, referring to (c) in FIG. 2, two opposite arms of the six arms are located on the same straight line, and there is an included angle between two adjacent arms. Described from an included angle at the upper left, a distribution of 30°, 120°, 30°, 30°, 120° and 30° may be formed clockwise. Alternatively, a position of one or several arms may be changed to change the angle distribution between adjacent arms with the distribution form of (c) in FIG. 2 as a reference, for example, six included angles are 60°, and then six capacitive expansion arms are evenly distributed on the two-dimensional plane. Certainly, the above-mentioned embodiment is only an example, and a deformation of the included angle may also be performed on the basis of the above-mentioned embodiment. For example, an included angle between two arms of the six arms is changed, and an included angle between two arms at the other opposite angle is adaptively changed while maintaining an axis symmetry; or the distribution of the capacitive expansion arms of the qubit may not be a symmetrical pattern after the change, such as the distribution form of the qubit illustrated in FIG. 4.

In an embodiment of the present disclosure, some of the plurality of two-dimensionally distributed qubits have the same number of arms, and some of the plurality of two-dimensionally distributed qubits have unequal numbers of arms; for the qubits having the same number of arms, the arms in each qubit are distributed in a partially same form, a completely same form or a completely different form.

Among the plurality of two-dimensionally distributed qubits, each qubit continuously expands to the outside by coupling with adjacent qubits. The "at least five arms" described in the present disclosure refers to a basic unit form in which each qubit may continuously expand. A qubit array form to be introduced below is described as having an array edge. In fact, qubits in a central region may be expanded infinitely, and then matched at an edge according to connection needs. In a formed expanded structure, qubits located in a middle region are all complete standard structures, that is, the situation that "a capacitor part of each of the qubits has at least five arms distributed two-dimensionally" described in the present disclosure. The qubit with a scalable capability has all the arms, and an edge part belongs to situation of partially same that "loses" half of a capacitive coupling arm. Qubits in the edge part are not limited here, and the qubits in the edge part may be adaptively added according to expansion needs of the middle region. As long as a distribution form and a expansion form of capacitive expansion arms of the qubits in the middle region are determined, a form of capacitive expansion arms of the qubits in the edge may also be determined accordingly. The "capacitive coupling arm" is an arm coupled with adjacent qubits in the capacitive expansion arm, excluding the capacitive expansion arm connected with the read coupling circuit and the control circuit.

Figure 3:
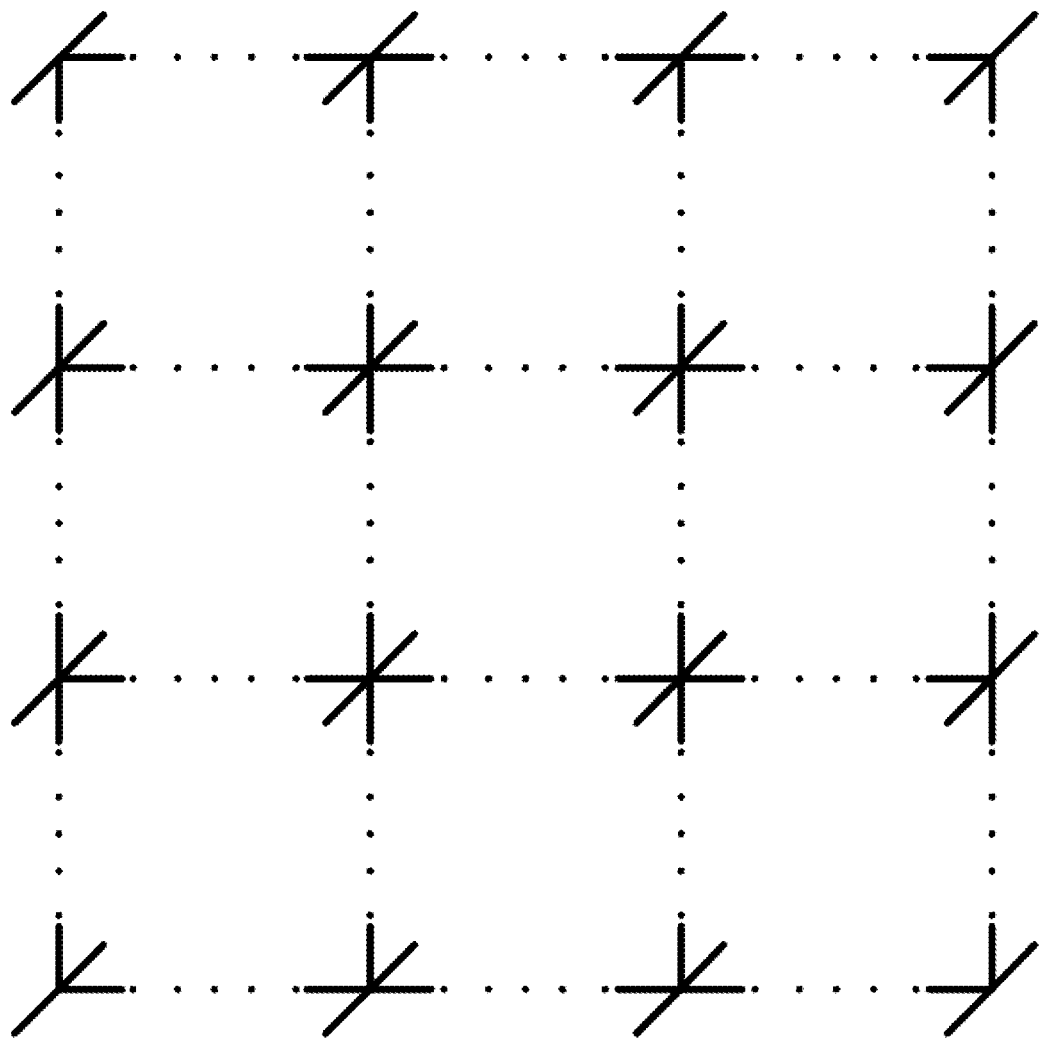
FIG. 3 to FIG. 5 show schematic diagrams of array distribution forms formed by different numbers of connection arms between qubits in a two-dimensional scalable superconducting qubit structure according to an embodiment of the present disclosure.
Figure 4:
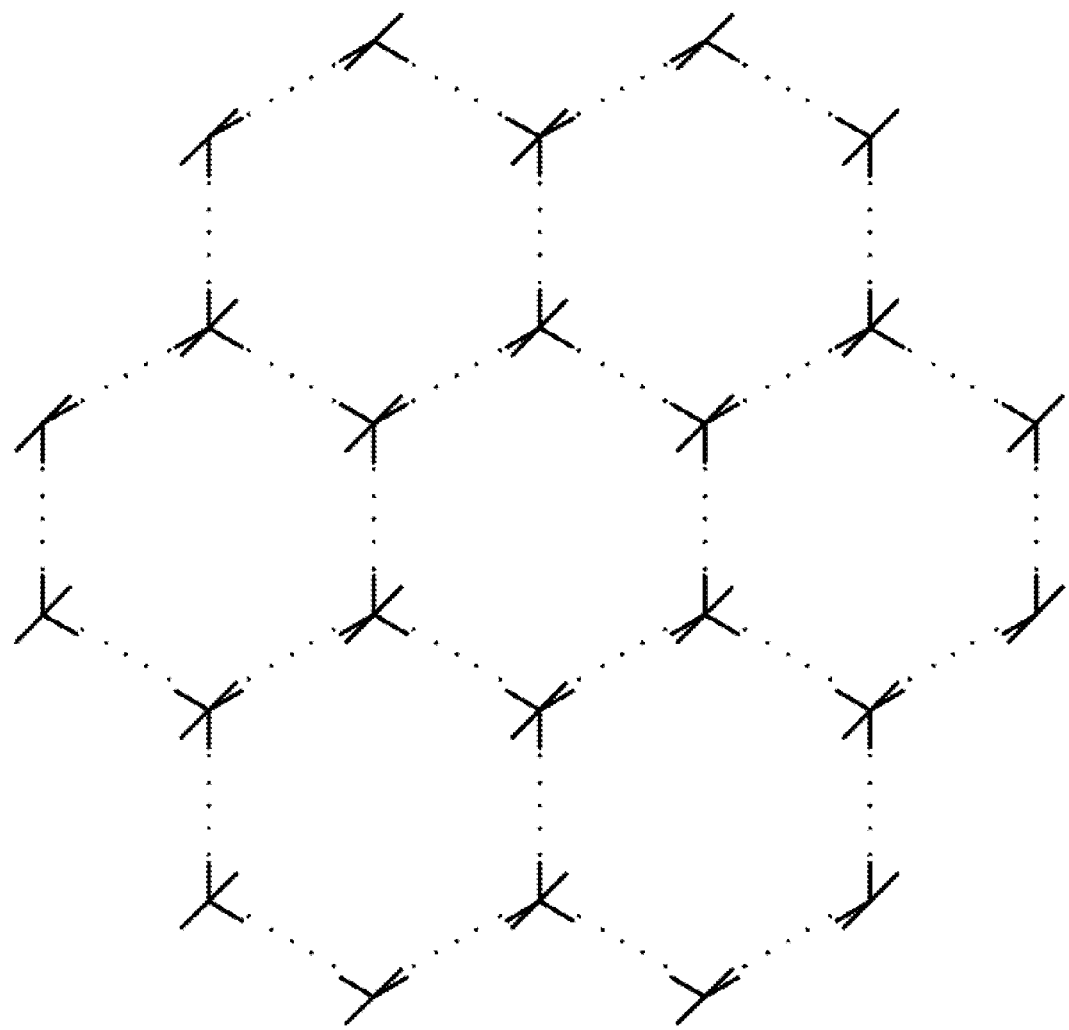
Figure 5:
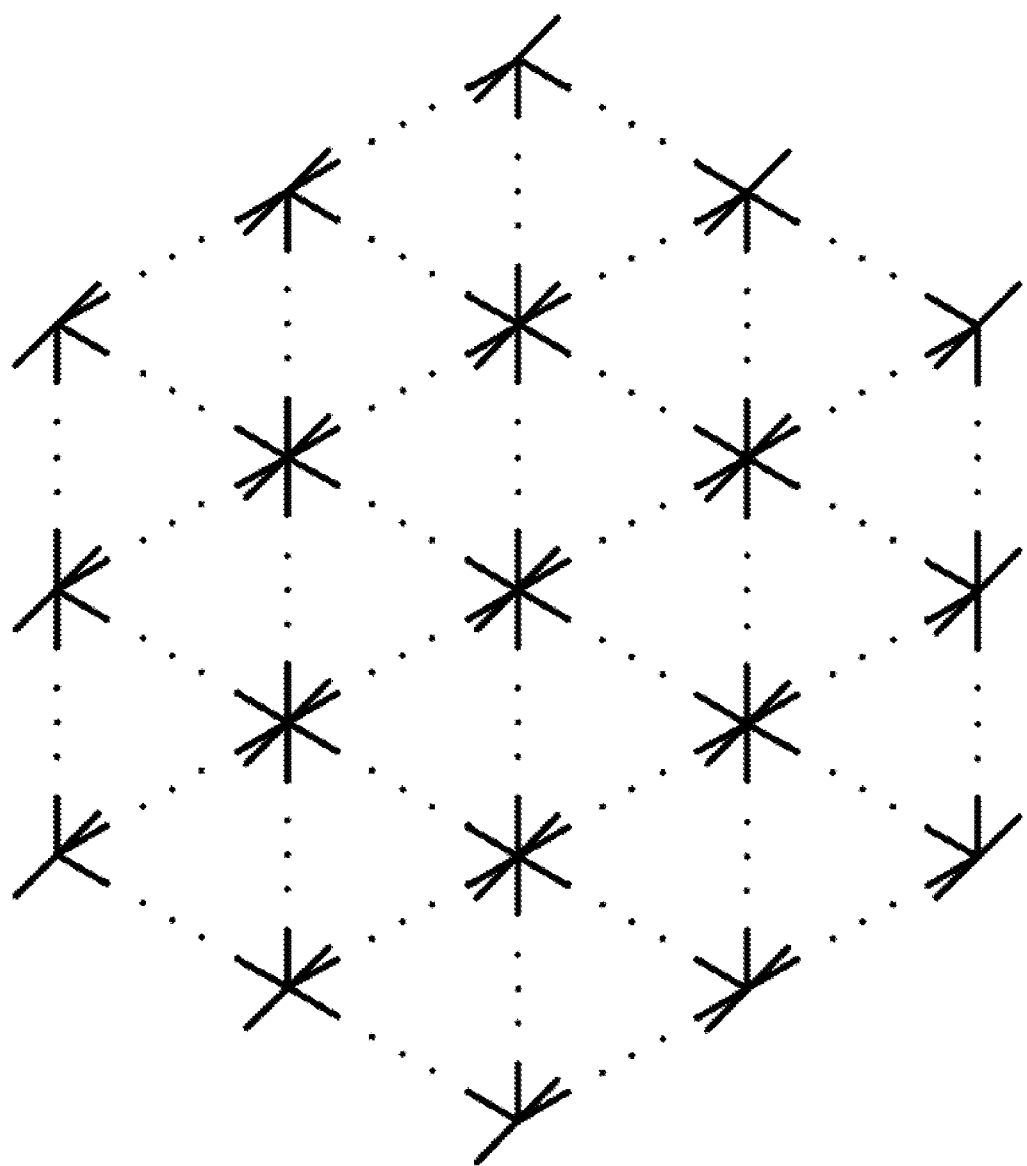

FIG. 3 to FIG. 5 show schematic diagrams of array distribution forms formed by different numbers of connection arms between qubits in a two-dimensional scalable superconducting qubit structure according to an embodiment of the present disclosure. FIG. 3 shows an exemplary array distribution form in which capacitive coupling arms of each qubit connected between the plurality of qubits are 4 arms; FIG. 4 shows an exemplary array distribution form in which capacitive coupling arms connected of each qubit between the plurality of qubits are 3 arms; and FIG. 5 shows an exemplary array distribution form in which capacitive coupling arms of each qubit connected between the plurality of qubits are 6 arms.

The plurality of two-dimensionally distributed qubits form a qubit array, and the qubit array includes one or more of following distribution forms: a honeycomb distribution, a grid-like distribution, a snowflake distribution or a tree-like distribution.

As mentioned above, for the qubits having the same number of arms, the arms in each qubit are distributed in a partially same form, a completely same form or a completely different form. For the case where the distribution forms of qubits are completely the same, please refer to the middle region shown in FIG. 3, and for the case where the distribution forms of qubits are partially the same, please refer to the middle region shown in FIG. 4. Expansion methods corresponding to the two cases are relatively simple, and may be replicated and expanded with a certain basic unit. For the case where the qubits in the same array are completely different, the qubits may be connected and expanded with reference to three different qubit forms in FIG. 3, FIG. 4 and FIG. 5, and the expansion method may be a mesh expansion or a dendritic expansion, etc. Included angles between arms of the qubits in each example may be changed to obtain completely different forms, which will not be illustrated here. In the qubit array described below with reference to FIG. 3 to FIG. 5, taking a distribution of the qubits in the middle region an example, the qubits in the marginal/edge part are used as an example in order to make the array have a visual boundary. In fact, the array may be expanded infinitely by removing the edge part in the drawings, or the edge part may be added under a required size or expansion specification.

Referring to FIG. 3, in an embodiment, the qubit has 6 capacitive expansion arms, 4 of which serve as capacitive coupling arms, which are coupled with adjacent qubits through a resonant cavity, and the plurality of qubits form a grid-like distribution after a two-dimensional expansion.

Referring to FIG. 4, in an embodiment, the qubit has 5 capacitive expansion arms, 3 of which serve as capacitively coupling arms, which are coupled with adjacent qubits through a resonant cavity, and the plurality of qubits form a honeycomb distribution after a two-dimensional expansion.

It should be noted that the forms of the above-mentioned examples in FIG. 3 and FIG. 4 are performed by a regular expansion, and the number of capacitive coupling arms coupled with other adjacent qubits in each qubit is equal in an array, for example, each qubit is connected with other qubits through 3 (as shown in FIG. 4) or 4 (as shown in FIG. 3) capacitive expansion arms. In other embodiments, in the same qubit array, there may be some qubits coupled with other qubits with a first number of capacitive coupling arms, and some qubits coupled with other qubits with a second number of capacitive coupling arms, and the first number is not equal to the second number.

Referring to FIG. 5, in an embodiment, the qubit has 8 capacitive expansion arms, 6 of which serve as capacitive coupling arms, which are coupled with adjacent qubits through a resonant cavity, and the plurality of qubits form a snowflake distribution after a two-dimensional expansion. Certainly, in the cases illustrated in FIG. 3, FIG. 4 or FIG. 5, by changing the included angle distribution of each arm, a tree-like distribution or other scalable array distribution forms may be formed, as long as arrays obtained by the expansion method in which each qubit mentioned in the present disclosure is connected with adjacent qubits through the other at least three arms are all within the scope of protection of the present disclosure.

In the present disclosure, each qubit is connected with a read coupling circuit. Certainly, adjacent qubits may share the read coupling circuit, so that the total number of read circuits may be reduced so as to simplify wiring. For example, in an embodiment of the present disclosure, at least two qubits share a read coupling circuit. For example, in an example, at least two qubits adjacent to each other on the left and right or up and down share a read coupling circuit. An example situation in which at least two qubits share a read coupling circuit will be described below with reference to FIG. 6.

Figure 6:
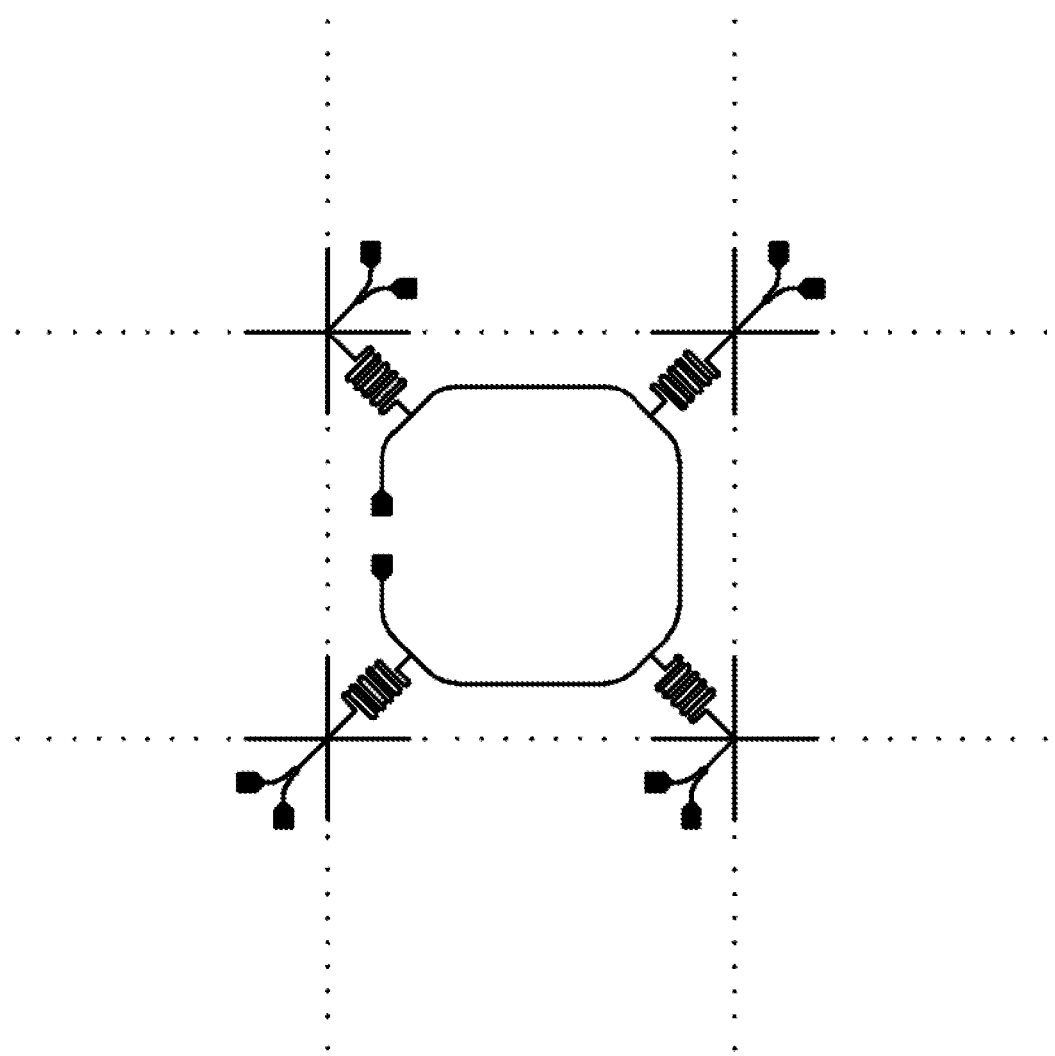
FIG. 6 shows a schematic diagram in which every 4 qubits in a qubit array share a read coupling circuit according to an embodiment of the present disclosure.

FIG. 6 shows a schematic diagram illustrating that every 4 qubits in a qubit array share a read coupling circuit according to an embodiment of the present disclosure.

In an embodiment of the present disclosure, as shown in FIG. 6, the plurality of two-dimensionally distributed qubits form a qubit array. In the qubit array of the embodiment, the plurality of qubits form a grid-like distribution, and every 4 qubits share a read coupling circuit. The form of a two-dimensionally distributed qubit array may be, but not limited to, a tree topology or a mesh topology.

In summary, the embodiment provides a two-dimensional scalable superconducting qubit structure. Among at least five arms provided based on a capacitor part of the qubit, one of two arms is connected with the read coupling circuit and the other is connected with the control circuit, and the other at least three arms are coupled with adjacent qubits in four directions respectively through the coupling cavity. That is, one of the other arms is connected with an adjacent qubit. A connection between each qubit and adjacent qubits and a signal reading and control of each qubit may be achieved by the above-mentioned expansion method, thereby achieving a connection between two adjacent qubits. A distribution form of the above-mentioned six arms and a connection method of the qubits may achieve a two-dimensional expansion with each qubit as a center. In addition, at least three arms are connected with adjacent qubits. The distribution of three arms may cover the two-dimensional plane, so that at least five arms are expanded and distributed on the two-dimensional plane. In this way, the structure facilitates a two-dimensional expansion, and is suitable for a connection between an existing flip-chip process or through-silicon via technology (TSV) and a signal fan-out board. Certainly, the above-mentioned two-dimensional scalable superconducting qubit structure may input and extract a signal from the middle of the quantum chip by means of cutting hole array, flip-chip bonding, TSV, etc., thereby effectively reducing a crosstalk between adjacent qubit signals. The form of the cutting hole array will be described in detail below in a second embodiment.

A Second Embodiment

In a second exemplary embodiment of the present disclosure, there is provided a method for controlling a cavity mode of a two-dimensional scalable superconducting qubit structure.

In an embodiment, there is provided a method for controlling a cavity mode of a two-dimensional scalable superconducting qubit structure. A three-dimensional lead structure is formed at a position of a non-qubit circuit in the superconducting qubit chip by using flip-chip bonding and through-silicon via processes, so as to perform a signal extraction. Each through-silicon via corresponds to a lead, and the read coupling circuit and the control circuit may be laid out by setting a distribution and a distance of each through-silicon via, thereby reducing signal crosstalk effects between read circuits, between control circuits, and between read and control circuits.

Figure 7:
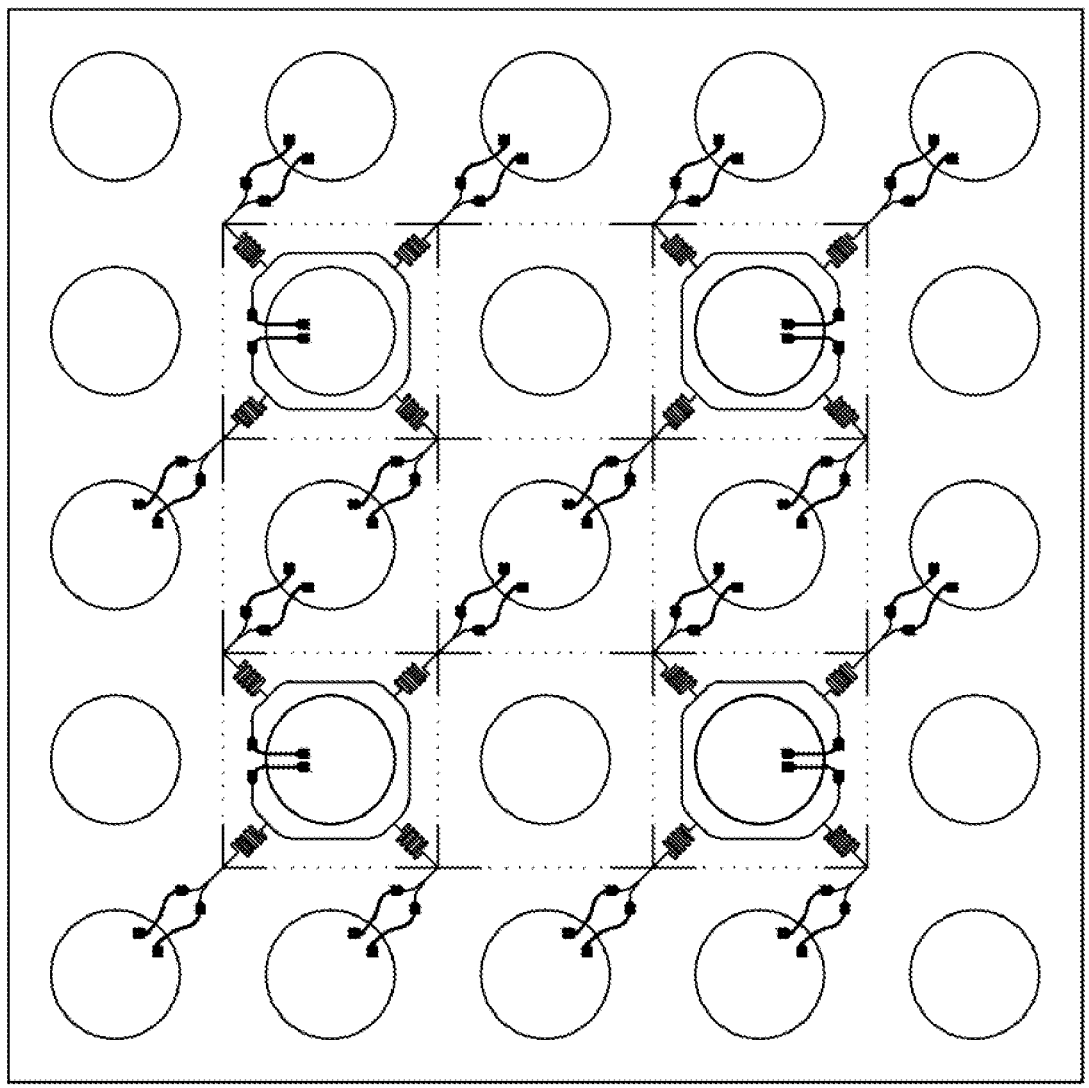
FIG. 7 shows a schematic diagram of a method for controlling a cavity mode of a two-dimensional scalable superconducting qubit structure according to an embodiment of the present disclosure.

FIG. 7 shows a schematic diagram of a method for controlling a cavity mode of a two-dimensional scalable superconducting qubit structure according to an embodiment of the present disclosure.

Referring to FIG. 7, in another embodiment, the method for controlling a cavity mode of a two-dimensional scalable superconducting qubit structure includes: making a plurality of holes at a position of a non-qubit circuit in the superconducting qubit chip, wherein a control circuit and a read coupling circuit of the qubits are wire-bonded to a package box or a circuit board through several holes of the plurality of holes.

In an embodiment of the present disclosure, control circuits between two adjacent qubits are extracted from different holes for bonding.

In an embodiment of the present disclosure, the holes are manufactured by laser cutting; certainly, the holes may be manufactured in other forms.

In an embodiment, the plurality of holes are distributed in an array.

In the embodiment, for example, in the two-dimensional scalable superconducting qubit structure shown in FIG. 6, the plurality of two-dimensionally distributed qubits form a qubit array, and every 4 qubits share a read coupling circuit. Here, a network unit is formed with 4 qubits, and the network unit is expanded to form a grid-like distribution form as an illustration. In the two-dimensional scalable superconducting qubit structure, in a region defined by 4 qubits, there are a plurality of holes in a non-circuit region, and the 4 qubits sharing a read coupling circuit are interconnected, and the shared read coupling circuit only needs to be wire-bonded to a macro package box or circuit board through one of the plurality of holes. In order to reduce a signal crosstalk between adjacent qubits, the control circuits between two adjacent qubits are extracted from different holes for bonding. In this way, corresponding several network units are in a form of grid-like distribution, and corresponding holes are also in a form of array distribution.

Certainly, the qubit array formed by the above-mentioned plurality of qubits takes a grid-like distribution as an example, and the qubit array may also be other types of array distribution forms, and the corresponding holes are also in the form of array distribution. When flip-chip bonding and through-silicon via processes are not provided or are thrown off, a plurality of holes (such as a laser-cut circular hole array) may be made at a position of a non-qubit circuit in the superconducting qubit chip, a control circuit and a read coupling circuit of the qubits are wire-bonded to a macro package box or circuit board through several holes of the plurality of holes, so that a wiring length of a two-dimensional qubit may be shortened, grounding of the chip may be better achieved, a crosstalk between adjacent bits may be reduced, and a resonance mode of the sample box may be suppressed. In this way, a scalability may be achieved to implement a plurality of quantum computing schemes such as error correcting codes, two-dimensional quantum simulation, etc., and a good application prospect is shown.

In summary, the present disclosure provides a two-dimensional scalable superconducting qubit structure and a method for controlling a cavity mode thereof. Among at least five capacitive expansion arms are provided based on a capacitor part of the qubit, one of two arms is connected with the read coupling circuit and the other is connected with the control circuit, and the other at least three arms are coupled with adjacent qubits respectively through the coupling cavity, thereby achieving a connection between two adjacent qubits. A distribution form of the above-mentioned capacitive expansion arms and a connection method of the qubits may achieve a two-dimensional expansion with each qubit as a center, which has a good scalability and diversity of distribution forms. The two-dimensional scalable superconducting qubit structure may input and extract a signal from the middle of the quantum chip by means of cutting hole array, flip-chip bonding, TSV, etc., so that a wiring length of a two-dimensional qubit may be shortened, grounding of the chip may be better achieved, a crosstalk between adjacent bits may be effectively reduced, and a resonance mode of the sample box may be suppressed. In this way, the optimal qubit performance may be obtained.

It should also be noted that although the present disclosure is described with reference to the drawings, the embodiments disclosed in the drawings are intended to illustrate the preferred embodiments of the present disclosure, and should not be construed as a limitation of the present disclosure. Size ratios in the drawings are merely schematic, and should not be construed as a limitation of the present disclosure. Directional terms mentioned in the embodiments, such as "up", "down", "front", "rear", "left", "right", etc., only refer to the directions in the drawings, and are not intended to limit the scope of protection of the present disclosure. Throughout the drawings, the same elements are indicated by the same or similar reference numerals. When it may cause confusion in the understanding of the present disclosure, conventional structures or configurations may be omitted.

Furthermore, the word "containing" or "including" does not exclude the presence of elements or steps not listed in the claims. The word "a" or "an" preceding an element does not exclude the presence of a plurality of the elements.

Unless there are technical obstacles or contradictions, the above-described various embodiments of the present disclosure may be freely combined to form additional embodiments, and these additional embodiments all fall within the scope of protection of the present disclosure.

The above-mentioned specific embodiments have described in detail the objectives, technical solutions and advantages of the present disclosure. It should be noted that the above are only specific embodiments of the present disclosure and are not intended to limit the present disclosure. Any modifications, equivalent substitutions, improvements, and the like made within the spirit and scope of the present disclosure shall be included in the scope of protection of the present disclosure.

What is claimed is:

1. A two-dimensional scalable superconducting qubit structure, comprising:
   a superconducting qubit chip comprising qubits that are two-dimensionally distributed, a plurality of holes, a read coupling circuits and control circuits;
   wherein a capacitor part of each of the qubits has at least five arms distributed two-dimensionally, two of the at least five arms in each of the qubits are respectively connected with a read coupling circuit of the read coupling circuits and a control circuit of the control circuits, and the other at least three arms are each coupled with an adjacent qubits through a respective coupling cavity, wherein the plurality of holes are distributed in a hole array, each hole of the plurality of holes surrounded by connections comprising the respective coupling cavity between adjacent qubits;
   wherein the qubits form a qubit array, and wherein the qubit array comprises a distribution form of a honeycomb distribution, a grid-like distribution, or a snowflake distribution.

2. The two-dimensional superconducting qubit structure according to claim 1, wherein a qubit of the qubits has a separate XY control circuit and a Z control circuit, or the qubit has only a XY control circuit.

3. The two-dimensional superconducting qubit structure according to claim 1, wherein at least two of the qubits share one of the reading coupling circuits.

4. The two-dimensional superconducting qubit structure according to claim 1, wherein the capacitor part of each of the qubits has six arms distributed two-dimensionally, and an included angle between two adjacent arms of the six arms in the qubit is greater than 0° and less than or equal to 180°.

5. The two-dimensional superconducting qubit structure according to claim 1, wherein some of the qubits have the same number of arms, and some of the qubits have different numbers of arms; for the qubits having the same number of arms, the arms in each qubit are distributed in a partially same form, a completely same form or a completely different form.

* * * * *